(12) United States Patent
Wu et al.

(10) Patent No.: US 7,074,525 B2
(45) Date of Patent: Jul. 11, 2006

(54) CRITICAL DIMENSION CONTROL OF PRINTED FEATURES USING NON-PRINTING FILL PATTERNS

(75) Inventors: Chung-Hsi J. Wu, Wappingers Falls, NY (US); Timothy Allan Brunner, Ridgefield, CT (US); Shahid Butt, Ossining, NY (US); Patrick Speno, Hopewell Junction, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 312 days.

(21) Appl. No.: 10/425,817

(22) Filed: Apr. 29, 2003

(65) Prior Publication Data

US 2004/0219435 A1 Nov. 4, 2004

(51) Int. Cl.
*G01F 9/00* (2006.01)
(52) U.S. Cl. .......................................................... 430/5
(58) Field of Classification Search .................... 430/5, 430/396, 311
See application file for complete search history.

(56) References Cited

U.S. PATENT DOCUMENTS 5,585,210 A * 12/1996 Lee et al. ..................... 430/5
5,725,973 A * 3/1998 Han et al. ..................... 430/5
5,821,014 A * 10/1998 Chen et al. ................... 430/5

* cited by examiner

*Primary Examiner*—S. Rosasco
(74) *Attorney, Agent, or Firm*—Slater & Matsil, L.L.P.

(57) ABSTRACT

Non-uniformity and image shortening are substantially reduced in an image printed on a substrate using a photolithographic mask in which the mask pattern includes at least one lines and spaces array adjacent to at least one clear region. At least one line feature is incorporated within the clear region of the mask pattern and is disposed in proximity to the lines and spaces array. The line feature has a line width that is smaller than a minimum resolution of the optical projection system. The image is printed by illuminating the photolithographic mask and projecting light transmitted through the photolithographic mask onto the substrate using the optical projection system.

36 Claims, 4 Drawing Sheets

CRITICAL DIMENSION CONTROL OF PRINTED FEATURES USING NON-PRINTING FILL PATTERNS

BACKGROUND OF THE INVENTION

The present invention relates to photolithographic processes and masks such as are used for the fabrication of semiconductor devices and, more particularly, to photolithographic processes and masks for printing sub-micron sized features on a substrate.

In existing optical photolithographic processes, a photolithographic mask, having various patterns that are to be printed on a substrate, is illuminated by a light source. The light is transmitted through the openings in the mask and collected by a projection lens that images the mask patterns onto a wafer or other substrate located at the image projection plane, typically at a predetermined reduction ratio. The focused image exposes one or more photoresist layers that were previously coated onto the wafer, and the exposed resist is then developed using a developer solution. The developer removes the exposed portions of the resist layer when a positive resist is used and removes the unexposed portions of the resist when a negative resist is used. As a result, the mask pattern is essentially transferred onto the resist and may be used to mask subsequent etching or doping steps.

As newer generations of denser and/or faster devices are introduced, smaller sized features must be printed on the surface of the wafer, extending the limits of optical photolithography. The optical photolithographic systems and resists are required to operate in regions of non-linear behavior, which often degrades the control of critical dimensions of the printed features. Further, as the feature sizes approach or become smaller than the wavelength of the light source used to illuminate the mask, optical distortions are introduced in the printed patterns. The optical distortions cause variations in the critical dimensions of the printed features that are related to the density, size and location of its adjacent features. As an example, dense lines and spaces arrays that adjoin a clear area are often subject to the effects of light scattered from the clear area into the array region, known as "flare", which can cause non-uniformity in the line widths of the array as a function of distance from the clear area. Further, the degree of non-uniformity in the line widths also depends on the size of the array. As a further example, dense lines and spaces arrays having staggered line ends are often prone to line end shortening cause by small changes in the focusing of the mask pattern. The critical dimension non-uniformity and line end shortening can cause increased contact resistance as well as open circuits in the final device.

A known approach for addressing these problems is to adjust the illumination conditions used when exposing the mask, such as adjusting the spatial coherency, the angle of illumination, the degree of defocusing and the exposure time. However, the optimal illumination conditions for reducing line shortening and non-uniformity are often not the best conditions for the resolution of the printed features.

Another existing approach is to adjust the mask bias. The edges of the features on the mask are extended to compensate for the line shortening or non-uniformity in the printed pattern on the wafer. However, as the device density grows and the feature sizes further shrink, there is often insufficient room between adjacent features on the mask to extend the edges to sufficiently compensate for these variations.

An additional known approach is to add shapes, known as serifs, to the mask pattern to add or subtract light in the areas where line shortening or corner rounding occurs which compensates for the shortening or rounding. This technique has the drawback, however, that the serifs are very small and make mask inspection and writing very difficult. Moreover, each feature may require multiple serifs, thereby greatly increasing the data that must be stored in the mask writing system when preparing such a mask. Additionally, the use of serifs becomes less effective as feature sizes decrease.

A further known alternative is described in U.S. Pat. No. 6,451,490 B1, titled "Method To Overcome Image Shortening By Use Of Sub-Resolution Reticle Features" to W. H. Advocate, et al., the disclosure of which is incorporated herein by reference. To address the problem of image shortening of dense array patterns, features smaller than the resolution capability of the photolithographic system, known as sub-resolution features, are added to the mask pattern and are oriented perpendicular to at least one feature of the dense array pattern. The sub-resolution features have a smaller width than that of the feature of the array pattern and do not print on the wafer. The sub-resolution features shown, however, are either located in the spaces between the features of the dense array pattern or bisect the features of the dense array pattern and therefore do not significantly reduce non-uniformity and are not optimally located for minimizing line shortening.

It is therefore desirable to reduce the line shortening or non-uniformity in printed arrays in a manner that avoids the above drawbacks.

SUMMARY OF THE INVENTION

The present invention addresses the problem of non-uniformity and line shortening in lines and spaces arrays by incorporating sub-resolution features in the clear regions that surround the lines and spaces arrays.

In accordance with an aspect of the invention, non-uniformity and image shortening are substantially reduced in an image printed on a substrate using a photolithographic mask having a mask pattern that includes at least one lines and spaces array adjacent to at least one clear region. The image is printed by illuminating the photolithographic mask and projecting light transmitted through the photolithographic mask onto the substrate using an optical projection system. At least one line feature is incorporated within the clear region of the mask pattern. The line feature is disposed in proximity to the lines and spaces array and has a line width that is smaller than a minimum resolution of the optical projection system.

In accordance with another aspect of the invention, a feature is printed on a substrate using an optical projection system. A photolithographic mask is irradiated using a light source. The photolithographic mask has a pattern that includes at least one lines and spaces array adjacent to at least one clear region and has a line feature disposed in the clear region. The line feature is in proximity to the lines and spaces array and has a line width that is smaller than a minimum resolution of the optical projection system. Light transmitted through the photolithographic mask is projected onto the substrate using the optical projection system.

In accordance with a further aspect of the invention, a photolithographic mask for use in an optical projection system is formed. A mask pattern is provided that includes at least one lines and spaces array adjacent to at least one clear region. At least one line feature is incorporated within the clear region of the mask pattern. The line feature is disposed in proximity to the lines and spaces array and has a line width that is smaller than a minimum resolution of the optical projection system.

In accordance with a still further aspect of the invention, a photolithographic mask is used in an optical projection system. A mask pattern includes at least one lines and spaces array adjacent to at least one clear region. At least one line feature is disposed within the clear region of the mask pattern. The line feature is disposed in proximity to the lines and spaces array and has a line width that is smaller than a minimum resolution of the optical projection system.

In accordance with the above aspects of the invention, adjacent ones of the lines and spaces array may have staggered ends. The line feature may be disposed in parallel with the lines of the lines and spaces array or may be disposed in a direction perpendicular to the lines of the lines and spaces array. The clear region may be adjacent to a length of a line of the lines and spaces array or may be adjacent to an end of the lines of the lines and spaces array. The clear region of the mask pattern may be an opening in an opaque region, a partially transmissive region, or a phase shifting region. A plurality of the line features may be each arranged in parallel with one another, and the line features may be arranged in a region having at least a 2 μm width.

The foregoing aspects, features and advantages of the present invention will be further appreciated when considered with reference to the following description of the preferred embodiments and accompanying drawings.

DETAILED DESCRIPTION

Figure 1:
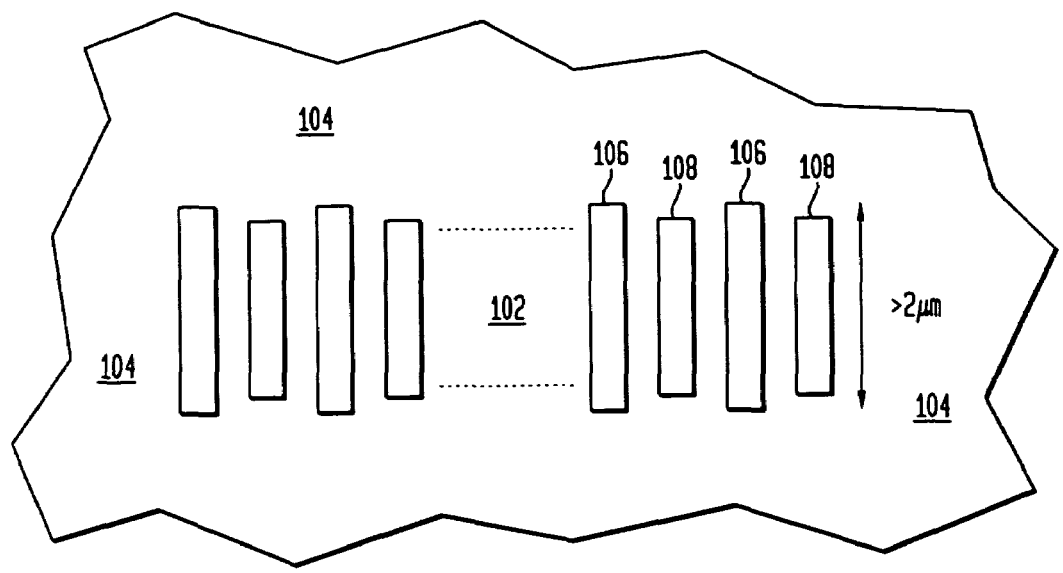
FIG. 1 is a diagram showing a portion of a photolithographic mask pattern in which a lines and spaces array is disposed within a clear region.

FIG. 1 shows a portion of a photolithographic mask in which a lines and spaces array pattern 102 is bordered on all sides by a clear region 104. The ends of adjacent lines 106, 108 may be staggered such that the ends of lines 106 extend further into the clear region than the ends of lines 108.

When the patterns on the mask have dimensions suitable for printing sub-micron sized features, the features printed on the substrate are often prone to various nonuniformity and/or line shortening problems caused by light that is transmitted through the clear regions and scattered in the array. As an example, a clear region located along a side of a lines and spaces array, namely along the length of the lines of the array, can introduce non-uniformities in the dimensions of the printed lines of the array printed. Additionally, the non-uniformity is more pronounced for smaller lines and spaces arrays than for larger lines and spaces arrays. As a further example, a clear area disposed at the ends of the lines and spaces array causes the printed features to be more sensitive to focusing variations.

Figure 2:
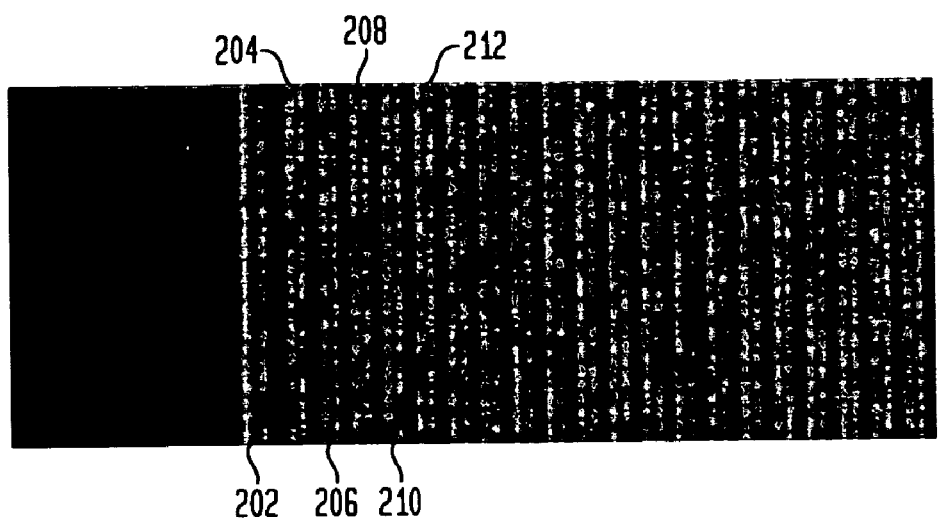
FIG. 2 illustrates a portion of a lines and spaces array printed using the mask pattern of FIG. 1.

FIG. 2 shows a scanning electron micrograph (SEM) of a portion of a lines and spaces array printed using a mask in which the lines and spaces pattern is adjacent to a clear area. The flare or light scattered from the clear areas creates a non-uniformity in the line widths of the printed lines such that line 202, which is closest to the clear area, appears significantly wider than the desired width. The adjacent lines 204, 206, 208, 210 appear smaller than desired because of the light scattered away from the lines. By contrast, the lines in the center of the array appear to be at or near the desired line width.

Figure 3:
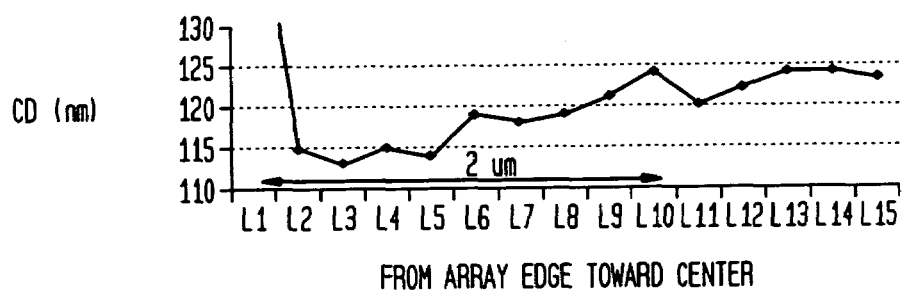
FIG. 3 is a graph showing the measured line widths of the lines of the lines and spaces array of FIG. 2.

FIG. 3 illustrates the measured line widths of the lines shown in FIG. 2. The outermost 2 μm portion of the lines and spaces array is most affected by flare so that the line nearest the clear region is significantly wider than the remaining lines and the remaining lines within the 2 μm region are smaller than the desired line width.

Figure 4A:
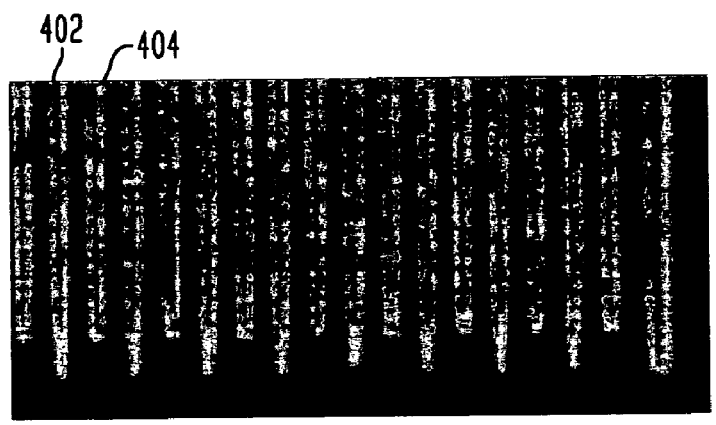
FIG. 4A illustrates the ends of a lines and spaces array printed using the mask pattern of FIG. 1 when the mask pattern is optimally focused on the substrate.
Figure 4B:
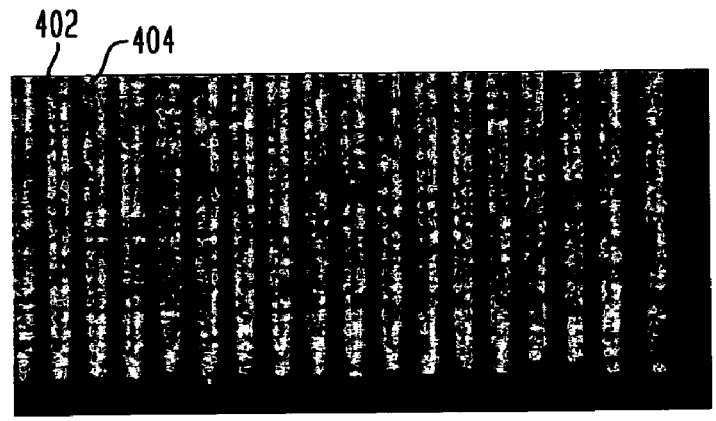
FIG. 4B illustrates the ends of a lines and spaces array printed using the mask pattern of FIG. 1 when the mask pattern is 0.3 μm out of focus on the substrate.

FIGS. 4A and 4B illustrate the sensitivity of the printed line ends of the lines and spaces array to defocusing caused by light scattered from a clear region disposed near the line ends.

FIG. 4A is a SEM showing the ends of a lines and spaces array printed using a mask in which the ends of adjacent lines are staggered. The pattern is printed with the image projected from the mask at its optimum focal position on the substrate. Thus, the printed pattern likewise shows the staggered line ends also present in the mask pattern. By contrast, FIG. 4B illustrates the same mask pattern printed with the projected image about 0.3 μm out of focus with respect to the plane of the substrate. The defocus causes the staggered line ends of the mask pattern to not appear on the printed pattern so that all of the lines appear to have the same length.

To alleviate the line width non-uniformity and the line end shortening caused by light scattered from the clear areas adjacent to the lines and spaces array, the invention incorporates one or more sub-resolution assist features in the clear areas. As an example, one or more solid lines are included in the clear areas to emulate the effects of a lines and spaces array. The width of the lines are narrower than the resolution limit of the optical projection system so that the lines are not printed and, instead, only the desired clear area appears on the substrate.

Figure 5:
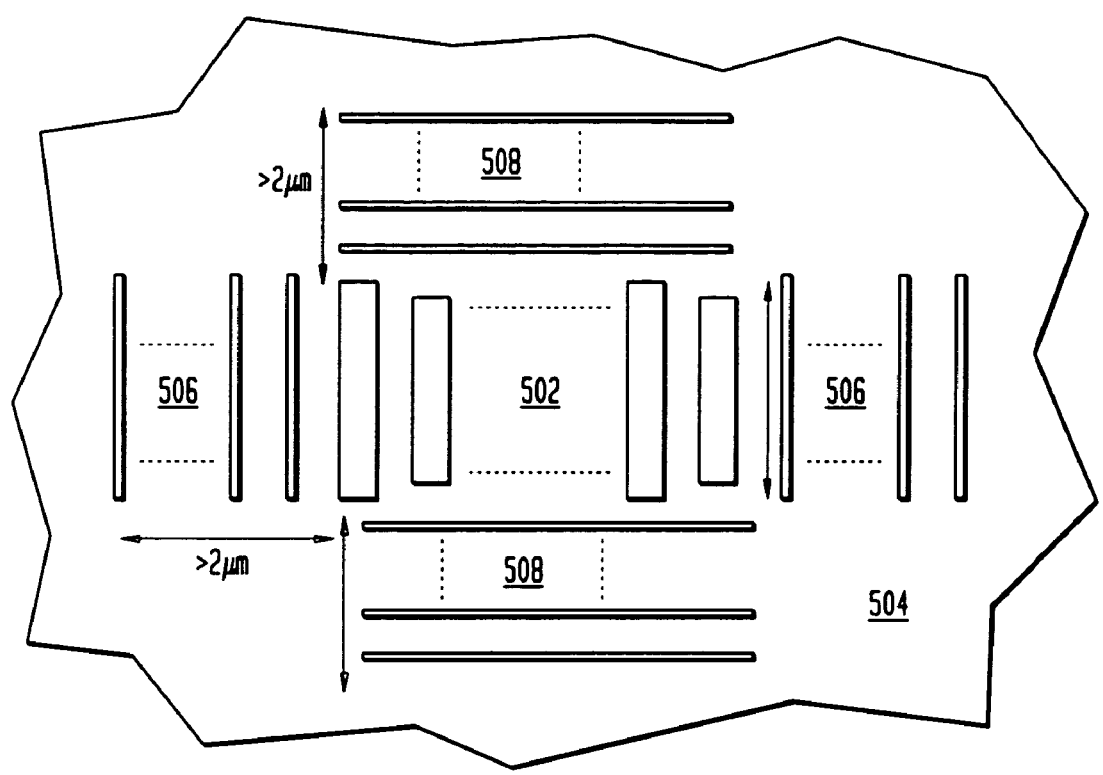
FIG. 5 is a diagram showing a portion of a mask pattern in accordance with the invention in which sub-resolution line features are included in the clear areas surrounding the lines and spaces array.

FIG. 5 shows a portion of a mask pattern in which sub-resolution assist features are incorporated in the clear areas in accordance with the invention. A lines and spaces array is bordered by a clear region 504. In the portion of the clear region along the length of the lines, sub-resolution assist features 506 are formed and are oriented in parallel with the lines of the lines and spaces array. Preferably, at least a 2 μm wide region is filled with the sub-resolution assist features to minimize the light scattered from the clear areas. Additionally, at the line ends of the lines and spaces array, further sub-resolution assist features 508 are present and are oriented in a direction perpendicular to the lines of the lines and spaces array. Again, a sufficient number of sub-resolution sized assist features to fill a 2 μm sized region of the clear are is preferred.

Though FIG. 5 shows only sub-resolution assist features that are oriented parallel with or in a direction perpendicular to the lines of the lines and spaces array, other orientations are also capable of alleviating the non-uniformity and line shortening effects.

Figure 6:
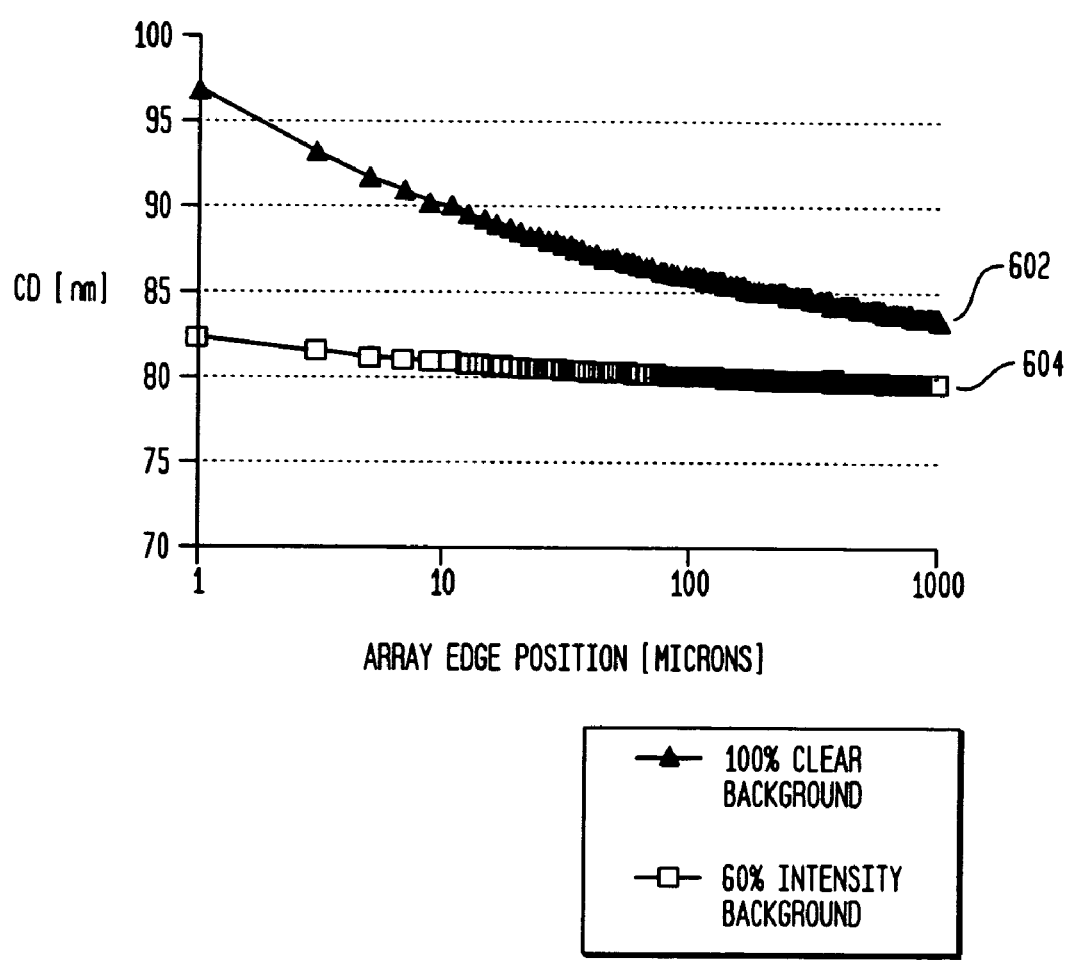
FIG. 6 is a graph showing the width of the lines of the lines and spaces array when the lines and spaces array is surrounded by clear region and when sub-resolution line features are included within the clear region.

FIG. 6 illustrates the effect of the flare from the clear areas for both a clear area that without the assist features and for a clear area that includes the sub-resolution assist features. Curve 602 shows the variation in line width as a function of distance from the edge of the array for a clear region without any sub-resolution assist features, namely a clear region having a 100% clear background. A significant nonuniformity is shown in the lines nearest the edge of the array that is caused by the flare from the clear areas. By contrast, curve 604 shows the effect of flare as a function of array edge position for a clear area which includes sub-resolution assist features that reduce the intensity of the light transmitted through the clear areas such that only 60% of the original light intensity is transmitted. Here, the variation in the line width of the lines nearest the edge of the lines and spaces array is significantly reduced.

Advantageously, the present invention provides sub-resolution assist features in the clear areas adjacent to the lines and spaces array that reduce the transparency of the clear areas and thereby reduce the effects of light scattering or flare. As a result, non-uniformity in the widths of the lines nearest the edge of the array is significantly reduced. Moreover, the reduction in non-uniformity allows for smaller lines an spaces arrays to be printed with substantially the same uniformity as larger lines and spaces arrays.

As a further advantage, the sub-resolution features of the invention reduce line shortening of the staggered line ends and allow for a greater acceptable degree of defocus in the printed pattern, thereby reducing the need for resist stripping and reworking of printed patterns.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of printing a feature on a substrate using an optical projection system, said method comprising:
   irradiating a photolithographic mask using a light source, said photolithographic mask having a mask pattern that includes at least one lines and spaces array surrounded by a clear region, the lines and spaces array having a plurality of lines separated from one another by spaces, said photolithographic mask further having a plurality of line features disposed in said clear region, a first one of said line features being in proximity to said lines and spaces array and extending parallel to said lines within said lines and spaces array, and a second one of said line features being in proximity to said lines and spaces array and extending perpendicular to said lines within the lines and spaces array, each of the line features having a line width that is smaller than a minimum resolution of said optical projection system; and
   projecting light transmitted through said photolithographic mask onto said substrate using said optical projection system.

2. The method of claim 1 wherein said lines within the lines and spaces array comprise lines having staggered ends.

3. The method of claim 2 wherein each line of the lines and spaces array has a length that is different than a length of an immediately adjacent line.

4. The method of claim 1 wherein a third one of said line features is disposed in parallel with said lines of said lines and spaces array, said third one of said line features being separated from said first one of said line features by said lines and spaces array.

5. The method of claim 4 wherein a fourth one of said line features is disposed in a direction perpendicular to said lines of said lines and spaces array, said fourth one of said line features being separated from said second one of said line features by said lines and spaces array.

6. The method of claim 1 wherein said clear region of said mask pattern comprises an opening in an opaque region.

7. The method of claim 1 wherein the first one of said lines features comprises one of a plurality of said line features each arranged in parallel with one another.

8. The method of claim 7 wherein said plurality of said line features are arranged in a region having at least a 2 µm width.

9. The method of claim 1 wherein said clear region of said mask pattern comprises a partially transmissive region.

10. The method of claim 1 wherein said clear region of said mask pattern comprises a phase shifting region.

11. The method of claim 1, wherein projecting light transmitted through said photolithographic mask onto said substrate comprises irradiating a portion of a photoresist layer over the substrate.

12. The method of claim 11, further comprising removing portion of the photoresist layer to create a mask pattern over the substrate.

13. The method of claim 12, further comprising performing an etching step using the mask pattern.

14. The method of claim 12, further comprising performing a doping step using the mask pattern.

15. A method of printing a feature on a substrate using an optical projection system, said method comprising:
   irradiating a photolithographic mask using a light source, said photolithographic mask having a mask pattern that includes at least one lines and spaces array surrounded by a clear region, the lines and spaces array having a plurality of lines separated from one another by spaces, each of the lines in the lines and spaces region having at least a minimum length, said photolithographic mask further having a first plurality of line features disposed in said clear region and a second plurality of line features disposed in said clear region, said first plurality of line features being arranged in parallel with one another and in parallel with and in proximity to said lines of said lines and spaces array and said second plurality of line features being arranged in parallel with one another and in parallel with and in proximity to said lines of said lines, and spaces array, said first plurality of line features being separated from said second plurality of line features by said lines and spaces array, wherein each of the plurality of line features has a length that is at least as long as the minimum length and each of said plurality of line features has a line width that is smaller than a minimum resolution of said optical projection system; and
   projecting light transmitted through said photolithographic mask onto said substrate using said optical projection system.

16. The method of claim 15 wherein said lines within the lines and spaces array comprise lines having staggered ends.

17. The method of claim 15 wherein said clear region of said mask pattern comprises an opening in an opaque region.

18. The method of claim 15 wherein said clear region of said mask pattern comprises a partially transmissive region.

19. The method of claim 15 wherein said clear region of said mask pattern comprises a phase shifting region.

20. The method of claim 15 wherein the photolithograph mask further includes a third plurality of line features adjacent a first end of the lines in the lines and spaces array and a fourth plurality of line features adjacent a second end of the lines in the lines and spaces array, the first end being opposite the second end.

21. The method of claim 15 wherein said first plurality of said line features are arranged in a region having at least a 2 µm width.

22. The method of claim 21 wherein said second plurality of said line features are arranged in a region having at least a 2 µm width.

23. The method of claim 15, wherein projecting light transmitted through said photolithographic mask onto said substrate comprises irradiating a portion of a photoresist layer over the substrate.

24. The method of claim 23, further comprising removing portion of the photoresist layer to create a mask pattern over the substrate.

25. The method of claim 24, further comprising performing an etching step using the mask pattern.

26. The method of claim 24, further comprising performing a doping step using the mask pattern.

27. A method of printing a feature on a substrate using an optical projection system; said method comprising:

irradiating a photolithographic mask using a light source, said photolithographic mask having a mask pattern that includes at least one lines and spaces array surrounded by a clear region, the lines and spaces array having a plurality of parallel lines separated from one another by spaces, the lines having staggered lengths so that each line is immediately adjacent a line having a different length, said photolithographic mask further having a first plurality of line features disposed in said clear region and a second plurality of line features disposed in said clear region, said first plurality of line features being located adjacent to a first end of the lines of said lines and spaces array and said second plurality of lines features being located adjacent a second end of the lines of said lines and spaces array, said first end being opposite said second end, said first and second pluralities of line features being arranged in parallel with one another and being arranged in a direction perpendicular to and in proximity to said lines of said lines and spaces array, each of said lines features having a line width that is smaller than a minimum resolution of said optical projection system; and projecting light transmitted through said photolithographic mask onto said substrate using said optical projection system.

28. The method of claim 27 wherein the photolithograph mask further includes a third plurality of line features adjacent a first outermost first one of the lines in the lines and spaces array and a fourth plurality of line features adjacent a second outermost one of the lines in the lines and spaces array, the third plurality being separated from the fourth plurality by the lines and spaces array.

29. The method of claim 27 wherein said clear region of said mask pattern comprises an opening in an opaque region.

30. The method of claim 27 wherein said clear region of said mask pattern comprises a partially transmissive region.

31. The method of claim 27 wherein said clear region of said mask pattern comprises a phase shifting region.

32. The method of claim 27 wherein said first plurality of said line features are arranged in a region having at least a 2 µm width.

33. The method of claim 27, wherein projecting light transmitted through said photolithographic mask onto said substrate comprises irradiating a portion of a photoresist layer over the substrate.

34. The method of claim 33, further comprising removing portion of the photoresist layer to create a mask pattern over the substrate.

35. The method of claim 34, further comprising performing an etching step using the mask pattern.

36. The method of claim 34, further comprising performing a doping step using the mask pattern.

* * * * *